United States Patent
Kim (10) Patent No.: US 10,809,627 B2
(45) Date of Patent: Oct. 20, 2020

(54) MASK, RELATED DISPLAY DEVICE, AND RELATED EXPOSURE METHOD FOR MANUFACTURING DISPLAY DEVICE

(71) Applicant: Samsung Display Co., Ltd., Yongin-Si, Gyeonggi-Do (KR)

(72) Inventor: Inwoo Kim, Asan-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 16/245,311

(22) Filed: Jan. 11, 2019

(65) Prior Publication Data

US 2019/0219928 A1  Jul. 18, 2019

(30) Foreign Application Priority Data

Jan. 16, 2018 (KR) .................. 10-2018-0005473

(51) Int. Cl.
*G03F 7/20* (2006.01)
*H01L 27/12* (2006.01)
*G03F 1/00* (2012.01)
(Continued)

(52) U.S. Cl.
CPC .......... *G03F 7/70475* (2013.01); *G03F 1/144* (2013.01); *G03F 1/38* (2013.01); *G03F 7/70466* (2013.01); *H01L 27/1251* (2013.01); *H01L 27/1288* (2013.01); *G02F 1/136209* (2013.01); *G02F 2001/13625* (2013.01);
(Continued)

(58) Field of Classification Search
CPC ............ H01L 27/1288; H01L 27/1251; G03F 7/70466; G03F 7/70475
See application file for complete search history.

(56) References Cited

U.S. PATENT DOCUMENTS 6,146,796 A * 11/2000 Kim ...................... G02F 1/1362
430/30
6,504,581 B1 * 1/2003 Hirosue ................ G02F 1/1362
349/1
(Continued)

FOREIGN PATENT DOCUMENTS

| KR | 10-0430798 B1 | 7/2004 |
| KR | 10-0483380 B1 | 7/2005 |

(Continued)

*Primary Examiner* — Eugene Lee
(74) *Attorney, Agent, or Firm* — Innovation Counsel LLP (57) ABSTRACT

An exposure mask includes an aligning portion and a boundary portion. The aligning portion may be aligned with pixel areas of a substrate and includes a first exposure member and a second exposure member. The boundary portion includes a first exposure element, a second exposure element, a third exposure element, and a fourth exposure element. The first exposure member, the first exposure element, and the second exposure element are positioned in a first row. The first exposure element is positioned between the first exposure member and the second exposure element and is larger than the second exposure element. The second exposure member, the third exposure element, and the fourth exposure element are positioned in a second row. The third exposure element is positioned between the second exposure member and the fourth exposure element and is smaller than the fourth exposure element. Each exposure member/element includes a light transmitter/blocker.

5 Claims, 7 Drawing Sheets

(51) Int. Cl.
  *G03F 1/38* (2012.01)
  *G02F 1/1362* (2006.01)
  *G02F 1/1333* (2006.01)

(52) U.S. Cl.
  CPC ............ *G02F 2001/133354* (2013.01); *G02F 2001/136222* (2013.01); *G02F 2201/123* (2013.01); *G03F 7/70433* (2013.01)

(56) References Cited

U.S. PATENT DOCUMENTS

| | | | |
|---|---|---|---|
| 6,606,141 B2* | 8/2003 | Takasugi | G02F 1/1362 349/139 |
| 7,136,120 B2* | 11/2006 | Ishino | G02F 1/1362 349/106 |
| 7,674,572 B2 | 3/2010 | Shin et al. | |
| 9,245,930 B2* | 1/2016 | Osako | G03F 1/42 |
| 2004/0252266 A1* | 12/2004 | Shimizu | G02F 1/133512 349/139 |
| 2005/0018111 A1* | 1/2005 | Tak | G02F 1/133512 349/110 |
| 2005/0074708 A1* | 4/2005 | Saluel | G03F 7/70433 430/394 |
| 2006/0057788 A1* | 3/2006 | Shin | G02F 1/1362 438/160 |
| 2011/0156039 A1* | 6/2011 | Baek | H01L 21/6875 257/59 |
| 2017/0301706 A1* | 10/2017 | Kadowaki | G03F 7/0007 |
| 2019/0378983 A1* | 12/2019 | Kim | H01L 27/1288 |

FOREIGN PATENT DOCUMENTS

| | | |
|---|---|---|
| KR | 10-0508021 B1 | 11/2005 |
| KR | 10-0529575 B1 | 2/2006 |
| KR | 10-0560979 B1 | 6/2006 |
| KR | 10-0662778 B1 | 1/2007 |
| KR | 10-0943405 B1 | 2/2010 |
| KR | 10-1068285 B1 | 9/2011 |
| KR | 2015-0114371 A | 10/2015 |

* cited by examiner

Stitch area

MASK, RELATED DISPLAY DEVICE, AND RELATED EXPOSURE METHOD FOR MANUFACTURING DISPLAY DEVICE

CROSS-REFERENCE TO RELATED APPLICATION

This application claims priority under 35 U.S.C. § 119 to Korean Patent Application No. 10-2018-0005473, filed on Jan. 16, 2018, in the Korean Intellectual Property Office (KIPO); the disclosure of the Korean Patent Application is incorporated by reference herein in its entirety.

BACKGROUND

1. Technical Field

The technical field may relate to a mask and to a manufacturing method of a display device using the mask for an exposure process.

2. Discussion of Related Art

In general, a flat panel display device, such as a liquid crystal display (LCD) device or an organic light emitting diode (OLED) display device, may include a pair of electric field generating electrodes and may include an electro-optical active layer interposed between the electric field generating electrodes. An LCD device includes a liquid crystal layer as an electro-optical active layer, and an OLED display device includes an organic light emitting layer as an electro-optical active layer.

One of the electric field generating electrodes is usually connected to a switching element to receive an electric signal, and the electro-optical active layer converts the electric signal into an optical signal to display a portion of an image.

A display device may be large in size. In manufacturing the display device, an active area of the display device substrate may be larger than an effective size of a mask. A divisional exposure method may be applied in a method of manufacturing the display device. In the divisional exposure method, the active area is divided into sub-areas, and the sub-areas are exposed with two or more shots. As a result of such a divisional exposure method, undesirable stitch defects, such as a brightness difference between the sub-areas or a mura at a boundary between the sub-areas, may occur.

This Background section is intended to provide useful background for understanding the technology. The Background section may include information not known or appreciated by those skilled in the pertinent art prior to a corresponding effective filing date of this application.

SUMMARY

Embodiments may be directed to a mask capable of minimizing stitch defects and reducing the number of exposure shots. Embodiments may be related to a manufacturing method of a display device using the mask.

According to an embodiment, an exposure mask used in an exposure process to manufacture a display device includes: an align exposure portion aligned accurately with pixels defined on a substrate; and a boundary exposure portion disposed adjacent to at least one side of the align exposure portion and having a pattern which has a size different from a size of a pattern on the pixels defined on the substrate. The boundary exposure portion includes a first row including a first pattern having a size which increases as a distance from the align exposure portion increases; and a second row including a second pattern having a size which decreases as a distance from the align exposure portion increases.

The first pattern may have a size substantially equal to a size of the second pattern in a same pixel pattern column.

The exposure mask may further include a third row which includes a third pattern having a size substantially equal to a size of the align exposure portion.

The third pattern may be disposed in a pixel pattern column different from a pixel pattern column in which the first pattern and the second pattern are disposed.

The first, second, and third patterns may be one of a spacer pattern, a contact hole pattern, and a common electrode pattern.

According to an embodiment, a display device includes: a substrate including a first area and a second area disposed between the first areas; a gate wiring and a data wiring formed on the substrate; a thin film transistor formed on the substrate and connected to the gate wiring and the data wiring; and a plurality of spacers disposed on the substrate along a plurality of rows and columns. The plurality of spacers are disposed in a first row of the first area with an area which increases as a distance from a central portion of the second area increases, disposed in a second row of the first area with an area which decreases as a distance from the central portion of the second area increases, and disposed in a third row of the first area with an area substantially equal to an area of the second area.

Heights of the plurality of spacers may change in proportion to a variation amount of the area of the plurality of spacers.

The plurality of spacers disposed in the first row may have a height greater than a height of the plurality of spacers disposed in the second area.

The plurality of spacers disposed in the second row may have a height less than a height of the plurality of spacers disposed in the second area.

According to an embodiment, an exposure mask used in an exposure process to manufacture a display device includes: an align exposure portion aligned accurately with pixels defined on a substrate; and a boundary exposure portion disposed adjacent to at least one side of the align exposure portion and shifted at a shift interval with respect to the pixels defined on the substrate. The boundary exposure portion includes a first row including a first pattern disposed at a shift interval which increases in a first direction as a distance from the align exposure portion increases; and a second row including a second pattern disposed at a shift interval which increases in a second direction as a distance from the align exposure portion increases.

The first direction may be a +X direction, and the second direction may be a −X direction.

The boundary exposure portion may further include: a third row, adjacent to the second row, which includes a third pattern disposed at a shift interval which increases in the −X direction as a distance from the align exposure portion increases; and a fourth row which includes a fourth pattern disposed at a shift interval which increases in the +X direction as a distance from the align exposure portion increases.

The first pattern and the second pattern may be respectively located in different pixel pattern columns, and the third pattern and the fourth pattern may be respectively located in different pixel pattern columns.

The first pattern and the third pattern may have a substantially equal shift interval in a same pixel pattern column, and the second pattern and the fourth pattern may have a substantially equal shift interval in a same pixel pattern column.

The first pattern and the second pattern may be color filter patterns.

The exposure mask may further include: a fifth pattern which is disposed adjacent to the first pattern and the third pattern in the first row and the third row, respectively, and is not shifted with respect to the pixels defined on the substrate; and a sixth pattern which is disposed adjacent to the second pattern and the fourth pattern in the second row and the fourth row, respectively, and is not shifted with respect to the pixels defined on the substrate.

The fifth pattern and the sixth pattern may be located in different pixel pattern columns.

The first direction may be a +X direction, and the second direction may be a +X direction.

The boundary exposure portion may further include: a third row, adjacent to the second row, which includes a third pattern disposed at a shift interval which increases in the −X direction as a distance from the align exposure portion increases; and a fourth row which includes a fourth pattern disposed at a shift interval which increases in the −X direction as a distance from the align exposure portion increases.

The first pattern and the second pattern may be respectively located in different pixel pattern columns, and the third pattern and the fourth pattern may be respectively located in different pixel pattern columns.

The first pattern and the third pattern may have a substantially equal shift interval in a same pixel pattern column, and the second pattern and the fourth pattern may have a substantially equal shift interval in a same pixel pattern column.

The exposure mask may further include: a fifth pattern which is disposed adjacent to the first pattern and the third pattern in the first row and the third row, respectively, and is not shifted with respect to the pixels defined on the substrate; and a sixth pattern which is disposed adjacent to the second pattern and the fourth pattern in the second row and the fourth row, respectively, and is not shifted with respect to the pixels defined on the substrate.

The fifth pattern and the sixth pattern may be located in different pixel pattern columns.

The first direction may be a +Y direction, and the second direction may be a −Y direction.

The exposure mask may further include: a third pattern which is disposed adjacent to the first pattern in the first row and is not shifted with respect to the pixels defined on the substrate; and a fourth pattern which is disposed adjacent to the second pattern in the second row and is not shifted with respect to the pixels defined on the substrate.

The first pattern and the second pattern may be black matrix patterns.

The first pattern and the second pattern may be one of a color filter pattern, a pixel electrode pattern, and a black matrix pattern.

According to an embodiment, an exposure method of a display device for exposing each area of a substrate defined with "n" number of exposure areas includes: performing a first exposure process to an n-th exposure area through an exposure mask, the exposure mask including an align exposure portion which is aligned accurately with pixels defined on the substrate; and a boundary exposure portion which has a pattern shifted in a row direction or a column direction at a shift interval with respect to the pixels defined on the substrate; and performing a second exposure process to an (n+1)-th exposure area by moving the exposure mask. The boundary exposure portion may have a width in a range from about 15 mm to about 20 mm in the row direction from the align exposure portion.

An embodiment may be related to an exposure mask for use in an exposure process for manufacturing a display device. The exposure mask may include an aligning exposure portion and a boundary exposure portion. The aligning exposure portion may be aligned with pixel areas defined on a substrate. The aligning exposure portion may include a first aligning exposure-defining element and a second aligning exposure-defining element. The boundary exposure portion may be adjacent to at least one side of the aligning exposure portion. The boundary exposure portion may include a first boundary exposure-defining element, a second boundary exposure-defining element, a third boundary exposure-defining element, and a fourth boundary exposure-defining element. The first aligning exposure-defining element, the first boundary exposure-defining element, and the second boundary exposure-defining element may be positioned in a first row of the exposure mask. The first boundary exposure-defining element may be positioned between the first aligning exposure-defining element and the second boundary exposure-defining element and may be larger than the second boundary exposure-defining element. The second aligning exposure-defining element, the third boundary exposure-defining element, and the fourth boundary exposure-defining element may be positioned in a second row of the exposure mask. The third boundary exposure-defining element may be positioned between the second aligning exposure-defining element and the fourth boundary exposure-defining element and may be smaller than the fourth boundary exposure-defining element. Each of the exposure-defining elements may be or may include a light transmitter or a light blocker.

The first boundary exposure-defining element and the third boundary exposure-defining element may have a same size and correspond to a same pixel area column defined on the substrate. The exposure mask may include a third row positioned between the first row and the second row of the exposure mask. The aligning exposure portion may include a third aligning exposure-defining element. The boundary exposure portion may include a fifth boundary exposure-defining element. The third aligning exposure-defining element and the fifth boundary exposure-defining element may be positioned in the third row of the exposure mask and may have a same size.

No intervening exposure-defining element may be positioned between the fifth boundary exposure-defining element and either of the first boundary exposure-defining element and the third boundary exposure-defining element. The fifth boundary exposure-defining element may correspond to a first pixel area column defined on the substrate. The first boundary exposure-defining element and the third boundary exposure-defining element correspond to a second pixel area column defined on the substrate. The first pixel area column may be different the second pixel area column.

The first boundary exposure-defining element may be configured for forming one of a spacer, a contact hole, and a common electrode of the display device.

An embodiment may be related to a display device. The display device may include the following elements: a substrate; a first transistor and a second transistor positioned on the substrate, wherein the first transistor may be as wide as the second transistor; a first spacer overlapping the first transistor and having a first side; and a second spacer overlapping the second transistor and having a second side. The first side may be substantially coplanar with the second side and may be wider than the second side.

The first spacer may be taller than the second spacer.

The display device may include the following elements: a third transistor and a fourth transistor positioned on the substrate, wherein the third transistor may be as wide as each of the fourth transistor and the first transistor; a third spacer overlapping the third transistor and having a third side; a fourth spacer overlapping the fourth transistor and having a fourth side. The third side may be substantially coplanar with the fourth side and may be narrower than the fourth side. The first spacer and the second spacer may be positioned in a first spacer row. The third spacer and the fourth spacer may be positioned in a second spacer row. The first spacer and the third spacer may be positioned in a first spacer column. The second spacer and the fourth spacer may be positioned in a second spacer column.

The display device may include the following elements: a third transistor positioned on the substrate, positioned between the first transistor and the second transistor, and being as wide as the second transistor; and a third spacer overlapping the third transistor, being shorter than the first spacer, and being taller than the second spacer.

An embodiment may be related to an exposure mask for use in an exposure process for manufacturing a display device. The exposure mask may include the following elements: an aligning exposure portion configured to be aligned with pixel areas defined on a substrate; and a boundary exposure portion disposed adjacent to at least one side of the aligning exposure portion. The boundary exposure portion may include first-row exposure-defining elements positioned along a first row and may include second-row exposure-defining elements positioned along a second row parallel to the first row. The first-row exposure-defining elements may be shifted in a first direction with reference to equally-spaced first-row reference areas, respectively, according to first-row shift intervals, respectively. Each of the equally-spaced first-row reference areas may be as large as each of the pixel areas. The first-row shift intervals may increase along the first direction. The second-row exposure-defining elements may be shifted in a second direction with reference to equally-spaced second-row reference areas, respectively, according to second-row shift intervals, respectively. Each of the equally-spaced second-row reference areas may be as large as each of the pixel areas. The second-row shift intervals may increase along the first direction. Each of the exposure-defining elements may be or may include a light transmitter or a light blocker.

The first direction may be opposite to the second direction.

The boundary exposure portion may include the following elements: third-row exposure-defining elements positioned along a third row adjacent to the second row, wherein the third-row exposure-defining elements may be shifted in the second direction with reference to equally-spaced third-row reference areas, respectively, according to third-row shift intervals, respectively, Each of the equally-spaced third-row reference areas may be as large as each of the pixel areas, and The third-row shift intervals may increase along the first direction; and fourth-row exposure-defining elements positioned along a fourth row, wherein the fourth-row exposure-defining elements may be shifted in the first direction with reference to equally-spaced fourth-row reference areas, respectively, according to fourth-row shift intervals, respectively, Each of the equally-spaced fourth-row reference areas may be as large as each of the pixel areas. The fourth-row shift intervals may increase along the first direction.

The first-row exposure-defining elements correspond to a first set of pixel area columns. The second-row exposure-defining elements correspond to a second set of pixel area columns different from the first set of pixel area columns.

One of the first-row exposure-defining elements and one of the third-row exposure-defining elements may be shifted in opposite directions according to shift intervals having a same size and correspond to a same pixel area column.

The first-row exposure-defining elements and the second-row exposure-defining elements may be configured for forming color filters.

The exposure mask may include the following elements: first-row exposure-facilitating elements disposed along the first row, respectively disposed immediately adjacent to the first-row exposure-defining elements, and configured to be respectively aligned with first-row pixel areas defined on the substrate, wherein each of the first-row pixel areas may be as large as each of the equally-spaced first-row reference areas; and second-row exposure-facilitating elements disposed along the second row, respectively disposed immediately adjacent to the second-row exposure-defining elements, and configured to be respectively aligned with second-row pixel areas defined on the substrate, wherein each of the second-row pixel areas may be as large as each of the equally-spaced second-row reference areas, and wherein each of the exposure-facilitating elements may be or may include a light transmitting element or a light blocking element.

The first-row exposure-facilitating elements may correspond to a first set of pixel area columns. The second-row exposure-facilitating elements may correspond to a second set of pixel area columns different from the first set of pixel area columns.

The first direction may be identical to the second direction.

The boundary exposure portion may include the following elements: third-row exposure-defining elements positioned along a third row adjacent to the second row, wherein the third-row exposure-defining elements may be shifted in a third direction with reference to equally-spaced third-row reference areas, respectively, according to third-row shift intervals, respectively, wherein each of the equally-spaced third-row reference areas may be as large as each of the pixel areas, and The third-row shift intervals may increase along the first direction, and wherein the third direction may be opposite to the first direction; and fourth-row exposure-defining elements positioned along a fourth row, wherein the fourth-row exposure-defining elements may be shifted in the third direction with reference to equally-spaced fourth-row reference areas, respectively, according to fourth-row shift intervals, respectively, wherein each of the equally-spaced fourth-row reference areas may be as large as each of the pixel areas, and wherein the fourth-row shift intervals may increase along the first direction.

The third-row exposure-defining elements may correspond to a first set of pixel area columns. The fourth-row exposure-defining elements may correspond to a second set of pixel area columns different from the first set of pixel area columns.

One of the first-row exposure-defining elements and one of the third-row exposure-defining elements may be shifted in opposite directions according to shift intervals having a same size and correspond to a same pixel area column.

The exposure mask may include the following elements: first-row exposure-facilitating elements disposed along the first row, respectively disposed immediately adjacent to the first-row exposure-defining elements, and configured to be respectively aligned with first-row pixel areas defined on the substrate, wherein each of the first-row pixel areas may be as large as each of the equally-spaced first-row reference areas; and second-row exposure-facilitating elements disposed along the second row, respectively disposed immediately adjacent to the second-row exposure-defining elements, and configured to be respectively aligned with second-row pixel areas defined on the substrate, wherein each of the second-row pixel areas may be as large as each of the equally-spaced second-row reference areas, and wherein each of the exposure-facilitating elements may be or may include a light transmitting element or a light blocking element.

The first-row exposure-facilitating elements may correspond to a first set of pixel area columns, and The second-row exposure-facilitating elements may correspond to a second set of pixel area columns different from the first set of pixel area columns.

The first direction may be perpendicular to the first row, and The second direction may be-opposite to the first direction.

The exposure mask may include the following elements: first-row exposure-facilitating elements disposed along the first row, respectively disposed immediately adjacent to the first-row exposure-defining elements, and configured to be respectively aligned with first-row pixel areas defined on the substrate. wherein each of the first-row pixel areas may be as large as each of the equally-spaced first-row reference areas; and second-row exposure-facilitating elements disposed along the second row, respectively disposed immediately adjacent to the second-row exposure-defining elements, and configured to be respectively aligned with second-row pixel areas defined on the substrate, wherein each of the second-row pixel areas may be as large as each of the equally-spaced second-row reference areas, and wherein each of the exposure-facilitating elements may be or may include a light transmitting element or a light blocking element.

The first-row exposure-defining elements and the second-row exposure-defining elements may be configured for forming black matrix members.

The first-row exposure-defining elements and the second-row exposure-defining elements may be configured for forming one of color filters, pixel electrodes, and black matrix members.

An embodiment may be related to an exposure method for manufacturing a display device. The exposure method may include the following steps: preparing a substrate; performing a first exposure process to a first exposure area of the substrate through an exposure mask, the exposure mask may include an aligning exposure portion aligned with pixel areas defined on the substrate, wherein the exposure mask may include a boundary exposure portion abutting the aligning exposure portion, wherein the boundary exposure portion may include exposure-defining elements that are shifted in a pixel-row direction or a pixel-column direction according to predetermined shift intervals with respect to equally-spaced reference areas defined on the substrate, and wherein each of the equally-spaced first-row reference areas may be as large as each of the pixel areas; positioning the exposure mask over a second exposure of the substrate; and performing a second exposure process to the second exposure area of the substrate. The boundary exposure portion may have a width in a range from about 15 mm to about 20 mm in the pixel-row direction.

DETAILED DESCRIPTION

Example embodiments are described with reference to the accompanying drawings. The example embodiments may be modified in various manners. The scope of practical embodiments is not limited to the example embodiments and should include all practical changes, equivalents, and substitutions.

Although the terms "first," "second," etc. may be used herein to describe various elements, these elements, should not be limited by these terms. These terms may be used to distinguish one element from another element. Thus, a first element may be termed a second element without departing from teachings of one or more embodiments. The description of an element as a "first" element may not require or imply the presence of a second element or other elements. The terms "first," "second," etc. may also be used herein to differentiate different categories or sets of elements. For conciseness, the terms "first," "second," etc. may represent "first-type (or first-set)," "second-type (or second-set)," etc., respectively.

In the drawings, thicknesses of layers may be illustrated in an enlarged manner for clarity and ease of description.

When a first element is referred to as being "on" a second element, the first element may be directly on the second element, or one or more intervening elements may be present between the first element and the second element. When a first element is referred to as being "directly on" a second element, no intended intervening elements (except environmental elements such as air) may be provided between the first element and the second element.

The spatially relative terms "below", "beneath", "lower", "above", "upper" and the like, may be used for ease of description to describe the relations between one element and another element as illustrated in the drawings. The spatially relative terms may encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in the other direction and thus the spatially relative terms may be interpreted differently depending on the orientations.

The term "connect" may mean "directly connected," "indirectly connect," or "electrically connect." The terms "comprises," "including," "includes" and/or "including" may specify the presence of stated steps and/or components, but do not preclude the presence or addition of one or more other steps and/or components. The term "align exposure portion" may mean "aligning exposure portion"; the term "pattern" may mean "model design," "model structure," "structure," "exposure-defining structure/element including/ is a light transmitter and/or a light blocker," "exposure-defining element," "light transmitter," or "light blocker"; the term "±X" may mean "−X and/or +X"; the term "±Y" may mean "−Y and/or +Y"; the term "exposure-defining element" may mean "light transmitter" or "light blocker"; the term "light transmitter/blocker" may mean "exposure-defining element"; "adjacent" may mean "immediately adjacent"; the term "pixel pattern" may mean "pixel area."

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms used herein (including technical and scientific terms) have the same meaning as commonly understood by those skilled in the art. Terms should be interpreted as having a meaning that is consistent with their meaning in the context of the relevant art and will not be interpreted in an ideal or excessively formal sense unless clearly defined in the specification.

Like reference numerals may refer to like elements.

Figure 1:
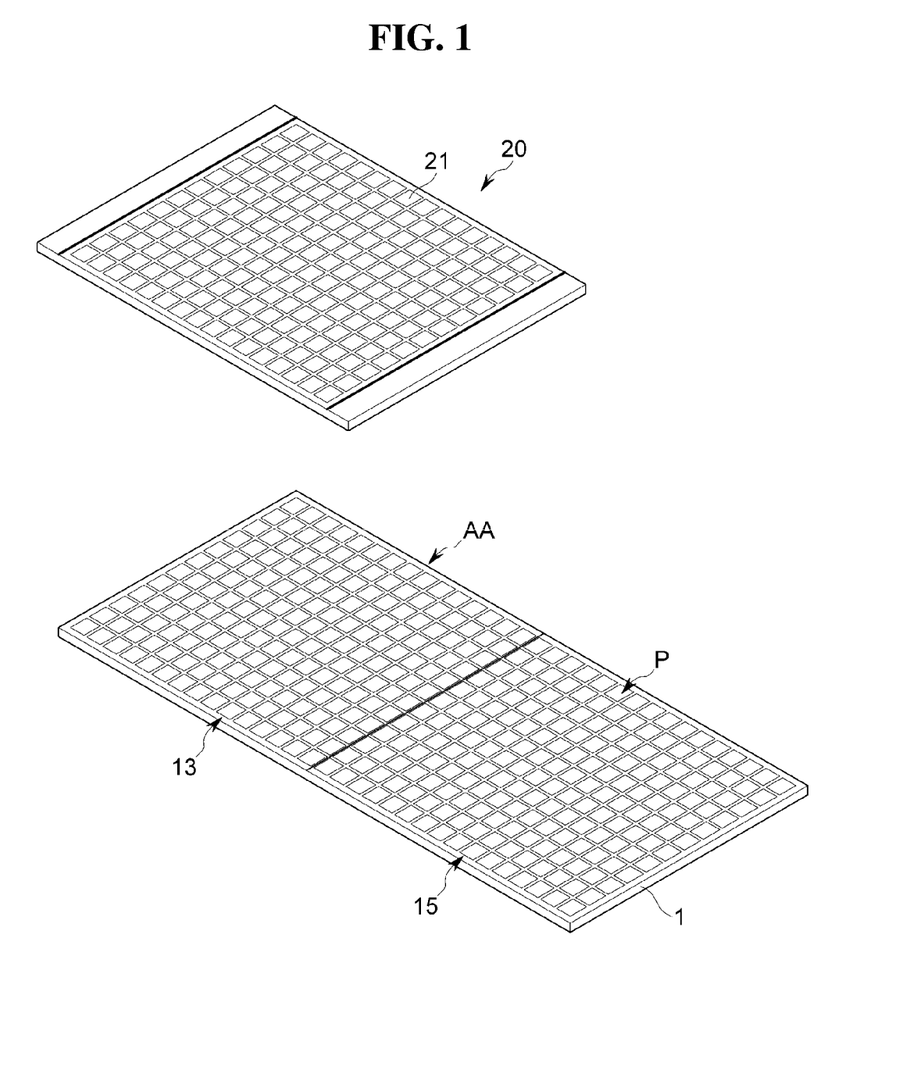
FIG. 1 is a perspective view schematically illustrating a divisional exposure process according to an embodiment.

FIG. 1 is a perspective view schematically illustrating a divisional exposure process according to an embodiment. For example, FIG. 1 is a view schematically illustrating an exposure process on a substrate divided into first and second exposure areas.

Referring to FIG. 1, a mask 20 is placed above a substrate 1. The substrate 1 includes an active area AA that is divided into first and second exposure areas 13 and 15. In an embodiment, the mask 20 is located at a position corresponding to the first exposure area 13 for exposing the first exposure area 13.

Next, a light is irradiated through the mask 20 to expose the first exposure area. An exposure portion 21 which corresponds to the first exposure area 13 of the substrate 1 is included in the mask 20. In the exposure portion 21, an opening portion and a blocking portion are defined such that the light is transmitted or blocked in a selective manner according to a desired pattern to form specified patterns in the exposure areas 13 and 15 of the substrate 1.

After the exposure process of the first exposure area 13 is completed, the mask 20 moves to expose the second exposure area 15, which neighbors the first exposure area 13, and thus the active area AA of a unit panel is entirely exposed in the divisional manner.

In the divisional exposure process for exposing one exposure area 13 and then exposing another exposure area 15 in a sequential manner, a misalignment may occur between the patterns close to an interface/boundary between the neighboring exposure areas 13 and 15 due to a misalignment of the mask 20. As a result, luminance non-uniformity may occur at the interface/boundary between the exposure areas 13 and 15, and stitch defects may occur whereby the boundary portion between the exposure areas 13 and 15 is undesirably visually recognized as a band.

Figure 2:
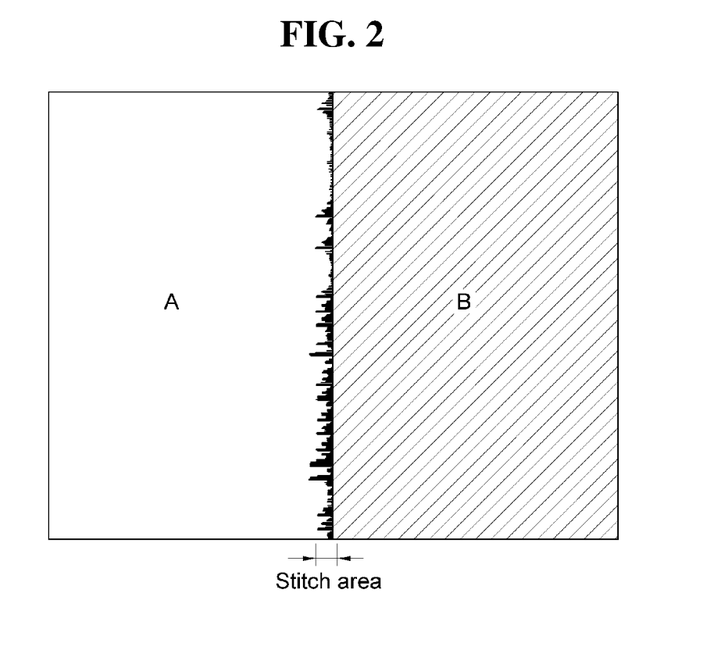
FIG. 2 is a plan view illustrating effects of two adjacent exposure shots in manufacturing of a display device according to an embodiment.
Figure 3:
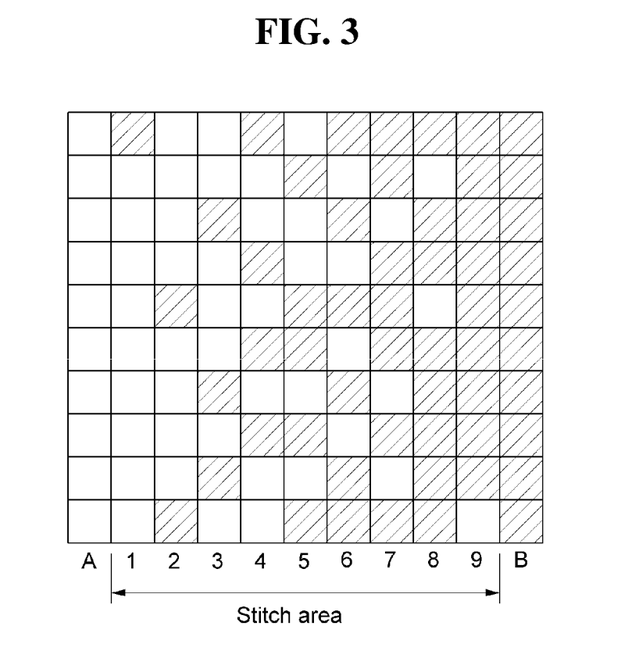
FIG. 3 is a view illustrating a portion of a stitch area illustrated in FIG. 2 according to an embodiment.

FIG. 2 is a plan view illustrating effects of two adjacent exposure shots in manufacturing of a display device, and FIG. 3 is a view illustrating a portion of a stitch area illustrated in FIG. 2.

Referring to FIG. 2, a stitch area, i.e., an area exposed in identical exposure steps for two adjacent exposure areas, is formed at a boundary portion between adjacent two exposure shots A and B performed for the exposure areas 13 and 15, respectively. Referring to FIG. 3, the stitch area, which is an overlap-exposure portion, may include a plurality of unit stitch areas, e.g., 10×9 unit stitch areas. Each unit stitch area may correspond to one unit pixel or several unit pixels. Several unit stitch areas may be combined to form one pixel.

Figure 4:
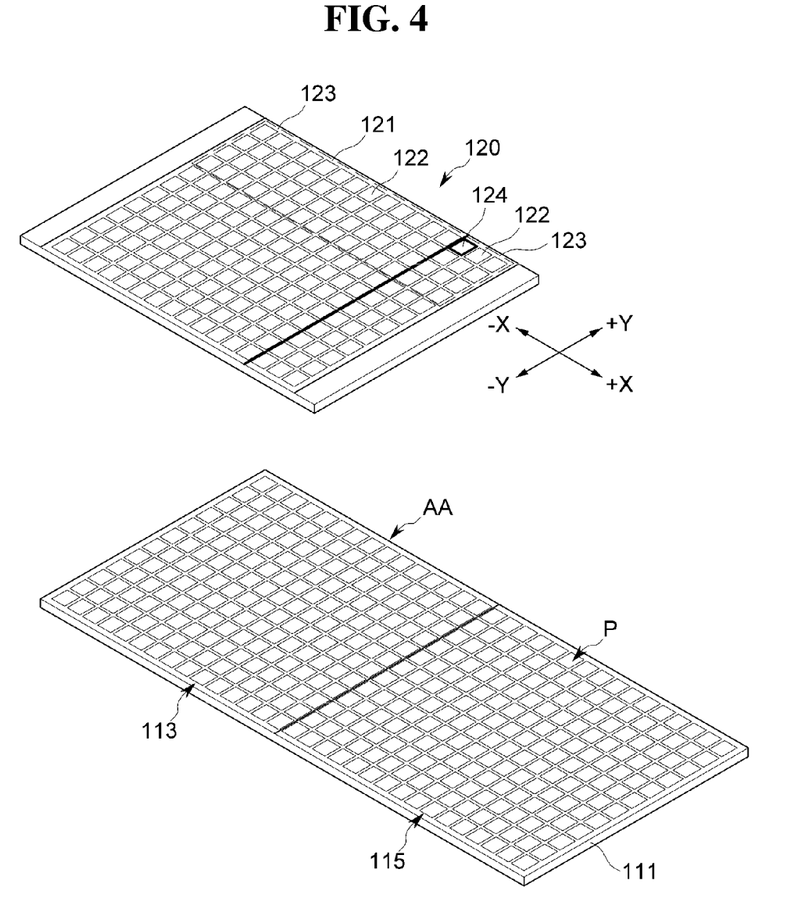
FIG. 4 is a perspective view schematically illustrating a divisional exposure process of a display device according to an embodiment.
Figure 5:
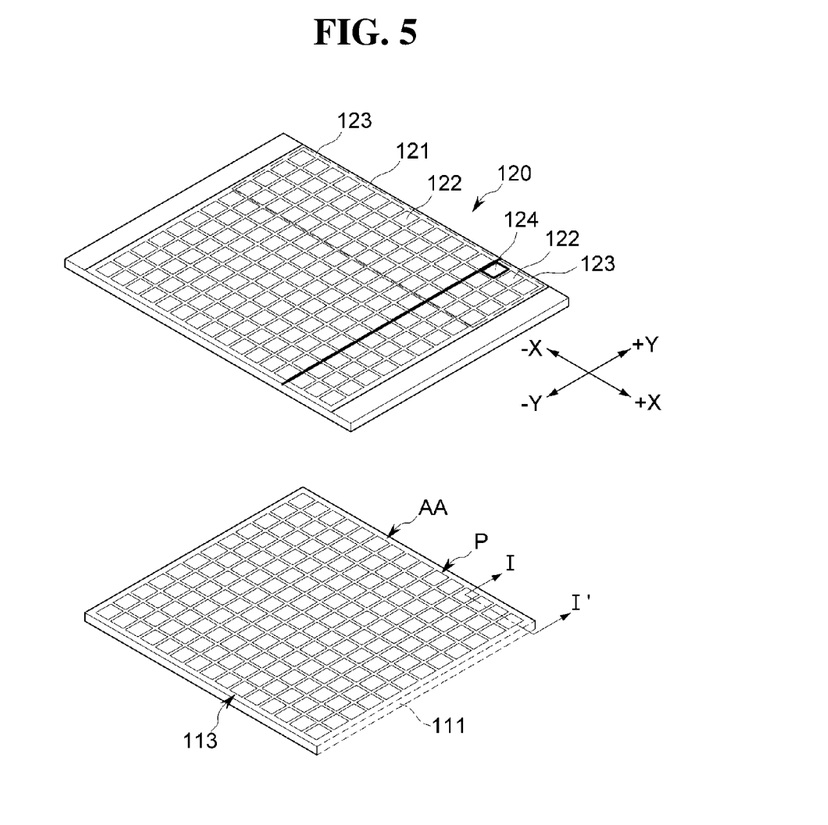
FIG. 5 is a view illustrating a stitch area and a first exposure area according to an embodiment.

FIG. 4 is a perspective view schematically illustrating a divisional exposure process for manufacturing a display device according to an embodiment. FIG. 5 is a view illustrating a stitch area and a first exposure area according to an embodiment.

Referring to FIG. 4, a substrate 111 includes an active area AA. The active area AA will include a plurality of pixels P and is divided into a first area 113 and a second exposure area 115. An exposure mask 120 is located above the substrate 111. The exposure mask 120 is located at a position corresponding to the first exposure area 113 for exposing the first exposure area 113.

In order to manufacture upper and lower substrates of the display device, exposure processes may be performed using a plurality of exposure masks, and each exposure mask may be used for the same number of times for different exposure areas. The size of the exposure mask 120 is considerably less than the area of the substrate 111. Thus, in order to form patterns and/or structures on the entire surface of the substrate 111, a divisional exposure method should be applied: the active area AA of the substrate 111 is divided into a plurality of areas, and each of the areas is sequentially exposed with a number of shots.

For example, the active area AA on the substrate 111 is divided into the first and second exposure areas 113 and 115 in order to proceed with the division exposure, and the exposure mask 120 is firstly located at a position corresponding to the first exposure area 113.

When/after an exposure process on the first exposure area 113 is completed by a first shot using the exposure mask 120 at the position corresponding to the first exposure area 113, the exposure mask 120 moves to a position corresponding to the second exposure area 115 to proceed with an exposure process by a second shot at the second exposure area 115.

According to an embodiment, the exposure mask 120 includes a plurality of exposure portions through which a light is irradiated corresponding to the pixels P defined on the substrate 111 in the active area AA. Each exposure portion has a pattern/structure including an opening/transmitting/transparent portion and a blocking portion, such that the light is transmitted or blocked in a selective manner to form desired patterns/structures on the exposure areas 113 and 115 of the substrate 111. In an embodiment, the exposure mask 120 includes an align exposure portion 121 and includes one or more boundary exposure portions 123 corresponding to the vicinity of one or more interfaces/boundaries between the first exposure area 113 and one or more other exposure areas, such as the second exposure area 115, of the substrate 111.

Referring to FIG. 5, the align exposure portion 121 includes a reference pattern 122 that matches (e.g., corresponds to) the design pattern/structure on the corresponding pixel defined on the substrate 111. As used herein, the design pattern/structure of the substrate 111 means a reference pattern/structure that is arranged on the substrate 111 with a predetermined size and position.

The boundary exposure portion 123 includes a reference pattern 122 that corresponds to the design pattern on the corresponding pixel defined on the substrate 111; the boundary exposure portion further includes a modified pattern/structure 124 which has an interval shifted in a row direction or a column direction with respect to the design pattern on the corresponding pixel defined on the substrate 111 and/or has a size different from a size of the design pattern.

Referring to FIGS. 4 and 5, when the exposure area 113 of the substrate 111 is exposed using such an exposure mask 120, a central portion of the substrate 111 is patterned through the align exposure portion 121 of the exposure mask 120, and a boundary portion of the substrate 111 is patterned through the boundary exposure portion 123 of the exposure mask 120.

In an embodiment, a boundary exposure portion 123 may include a reference pattern 122 which matches (e.g., corresponds to) the design pattern on the corresponding pixel defined on the substrate 111, and the boundary exposure portion 123 may include a modified pattern 124 which is regularly shifted in the row direction (±X-axis direction in the drawings) or the column direction (±Y-axis direction in the drawings). Accordingly, a designed pattern corresponding to the reference pattern 122 and a shifted pattern corresponding to the modified pattern are formed on the stitch area of the substrate 111. In an embodiment, the manufactured pattern/structure may be one or more of a color filter pattern/structure, a pixel electrode pattern/structure, and a black matrix pattern/structure.

In an embodiment, a boundary exposure portion 123 may include a reference pattern 122 which matches (e.g., corresponds to) the design pattern on the corresponding pixel defined on the substrate 111, and the boundary exposure portion 123 may include a modified pattern 124 which has a size different from a size of the design pattern on the pixel. Accordingly, a pattern corresponding to the reference pattern 122 and a shifted pattern having a different size corresponding to the modified pattern are formed on the stitch area of the substrate 111. In an embodiment, the manufactured pattern/structure may be one of a spacer pattern, a contact hole pattern, and a common electrode pattern.

The modified pattern/structure 124 may be arranged at gradually shifted intervals and/or may have a gradually increasing or decreasing size in the boundary exposure portion 123.

Figure 6:
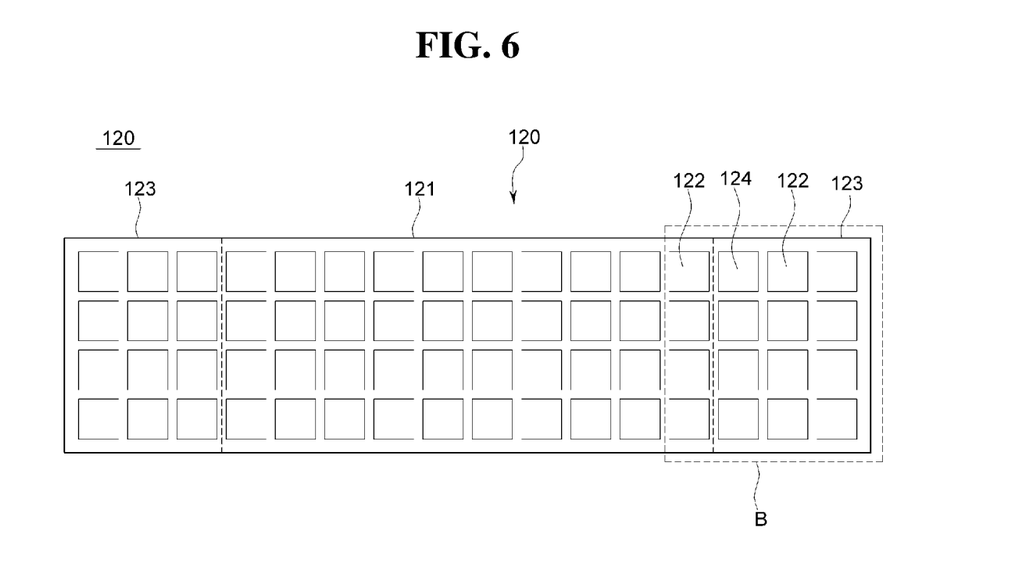
FIG. 6 is a plan view illustrating a part of an exposure mask according to an embodiment.

FIG. 6 is a plan view illustrating a part of an exposure mask. Each of the two boundary exposure portions 123 includes three pattern columns on one of two opposite sides of the exposure mask 120.

For example, a combination of the two boundary exposure portions 123 has a width in a range from about 15 mm to about 20 mm in the row direction. A modified pattern 124, which is different from a reference pattern 122 of the boundary exposure portion 123, is gradually shifted and/or has a gradually different size in the row direction or the column direction.

Figure 7:
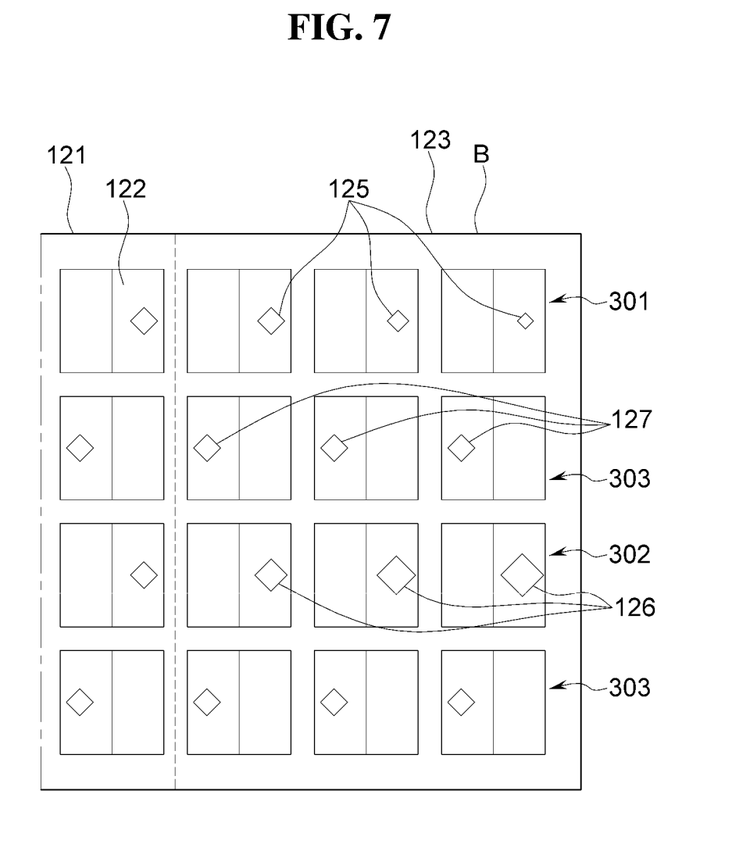
FIG. 7 is a plan view schematically illustrating elements and/or features in a boundary exposure portion of an exposure mask according to a first embodiment.

FIG. 7 is a plan view schematically illustrating a pattern formed in a part S of a boundary exposure portion of an exposure mask (e.g., the exposure mask 120 illustrated in FIG. 6) according to a first embodiment.

Referring to FIGS. 6 and 7, the part S of the exposure mask according to a first embodiment includes an align exposure portion 121 which is (configured to be) aligned substantially accurately with pixels defined on a substrate, and the part S includes a boundary exposure portion 123 which includes a modified pattern disposed adjacent to at least one side of the align exposure portion 121 and having a size different from a size of a pattern on the pixels defined on the substrate.

The boundary exposure portion 123 includes a first pattern/structure row 301 and a second pattern/structure row 302. The first row 301 includes a first pattern 125 having exposure-defining element areas (i.e., light transmitter areas or light blocker areas) which decrease as distances from the align exposure portion 121 increase, and the second row 302 includes a second pattern/structure 126 having exposure-defining element areas which increase as distances from the align exposure portion 121 increase. A light transmitter may be surrounded by a corresponding light blocker. A light blocker may be surrounded by a corresponding light transmitter.

The first pattern 125 may have reduced light transmitter/blocker areas according to predetermined ratios with respect to the light transmitter/blocker area of the reference pattern 122, and the second pattern 126 may have enlarged light transmitter/blocker areas according to predetermined ratios with respect to the light transmitter/blocker area of the reference pattern 122. In an embodiment, the area increase rate of the first pattern 125 may be substantially equal to the area reduction rate of the second pattern 126 in a same pixel pattern column.

In an embodiment, the boundary exposure portion 123 includes a third row 303. The third row 303 includes a third pattern 127 having one or more light transmitter/blocker area substantially equal to a light transmitter/blocker area of the reference pattern 122 of the align exposure portion 121. The third row 303 may be located between the first row 301 and the second row 302.

The third pattern 127 may be disposed in a pixel pattern column different from a pixel pattern column in which the first pattern 125 and the second pattern 126 are disposed.

The first, second, and third patterns may be used for forming spacer patterns on a substrate.

According to an embodiment, a light transmitter/blocker area of the first pattern 125 in the first row 301 may decrease by an amount in a range of about 0.16 µm$^2$ to about 0.64 µm$^2$ as the distance from the align exposure portion 121 increases by every two pixel column widths. In an embodiment, a light transmitter/blocker area of the second pattern 126 in the second row 302 may increase by an amount in a range of about 0.16 µm$^2$ to about 0.64 µm$^2$ as the distance from the align exposure portion 121 increases by every two pixel column widths. The third pattern 127 in the third row 303 has a light transmitter/blocker area substantially equal to a light transmitter/blocker area of the reference pattern 122 of the align exposure portion 121 in every two pixel columns.

In an embodiment, each light transmitter/blocker may have a shape of a polygon having parallel sides. In an embodiment, a side of a light transmitter/blocker of the first pattern 125 in the first row 301 may decrease by an amount in a range of about 0.4 μm to about 0.8 μm as the distance from the align exposure portion 121 increases by every two pixel column widths. In an embodiment, a side of a light transmitter/blocker of the second pattern 126 in the second row 302 may increase by an amount in a range of about 0.4 μm to about 0.8 μm as the distance from the align exposure portion 121 increases by every two pixel column widths. The sides of light transmitters/blockers the third pattern 127 in the third row 303 have lengths substantially equal to corresponding lengths of light transmitters/blockers of the reference pattern 122 of the align exposure portion 121 in every two pixel columns.

Figure 8:
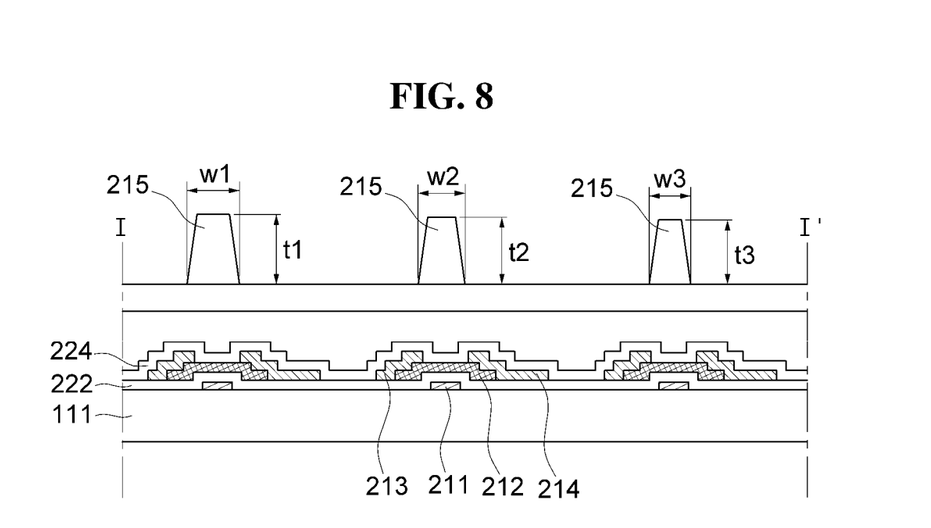
FIG. 8 is a cross-sectional view taken along line I-I' of FIG. 5 according to an embodiment.

FIG. 8 is a cross-sectional view taken along line I-I' of FIG. 5. The display substrate 111 includes spacers 215 patterned/formed using the exposure mask illustrated in FIG. 7.

Referring to FIG. 8, the spacers 215 are disposed on thin film transistors.

In an embodiment, a thin film transistor includes a gate electrode 211 connected to a gate line, a semiconductor layer 212 disposed on the gate electrode 211, and a source electrode 213 and a drain electrode 214 disposed on the semiconductor layer 212. The gate electrode 211 receives a scan signal from the gate line, the semiconductor layer 212 is activated to form a channel according to the scan signal applied to the gate electrode 211, and the source electrode 213 and the drain electrode 214 transmits an image signal input through a data line into pixels as the semiconductor layer 212 is activated. The substrate 111 may include insulators 222 and 224 for insulating elements of the thin film transistors.

In an embodiment, referring to FIG. 8, widths (W1>W2>W3) of the spacers increase or decrease by an amount in a range of about 0.4 μm to about 0.8 μm as a distance from an align exposure area increases by every two pixel column widths. In an embodiment, bottom areas of the spacers increase or decrease by an amount in a range of about 0.16 μm² to about 0.64 μm² as the distance from the align exposure area increases by every two pixel column widths. In an embodiment, heights (t1>t2>t3) of the spacers increase or decrease in proportion to the variation of the widths of the spacers.

According to an embodiment, at a boundary area of the substrate 111 which is patterned by the exposure mask according, the spacers have gradually larger bottom areas or gradually greater heights in a first row corresponding to the first row 301, have gradually smaller bottom areas or gradually shorter heights in a second row corresponding to the second row 302, and have substantially equal areas or substantially equal heights in a third row corresponding to the third row 303.

Light transmitters/blockers of patterns of the boundary exposure portion 123 may gradually, monotonically, and/or strictly increase or decrease along pixel rows. In an embodiment, light transmitters/blockers of patterns of a boundary exposure portion may gradually, monotonically, and/or strictly increase or decrease along pixel columns.

With the above-described configuration, the substrate 111 has different cell gaps for liquid crystals for different rows and/or different columns in the stitch area. Therefore, the display device may have different transmittances for different rows or for columns in the stitch area due to different pre-tilts of liquid crystals. Advantageously, the stitch area may be substantially prevented from being visually recognizable or conspicuous.

Figure 9:
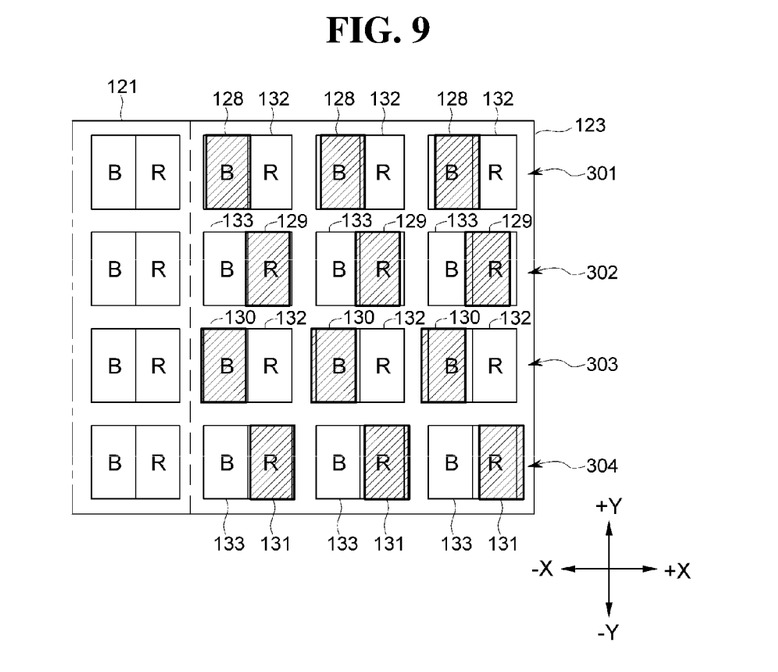
FIG. 9 is a plan view schematically illustrating pixel patterns/structures formed at a boundary exposure portion of an exposure mask according to a second embodiment.
Figure 10:
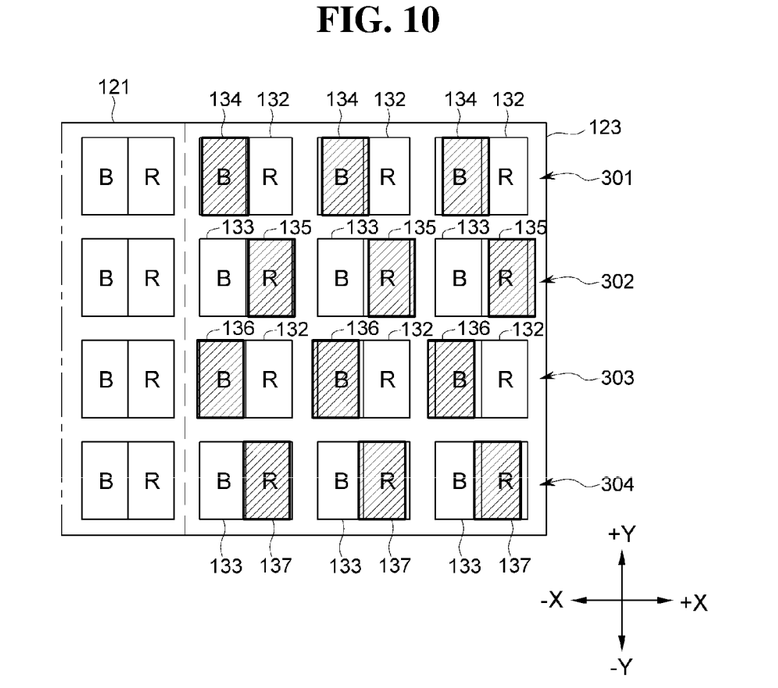
FIG. 10 is a plan view schematically illustrating pixel patterns/structures formed at a boundary exposure portion of an exposure mask according to a third embodiment.
Figure 11:
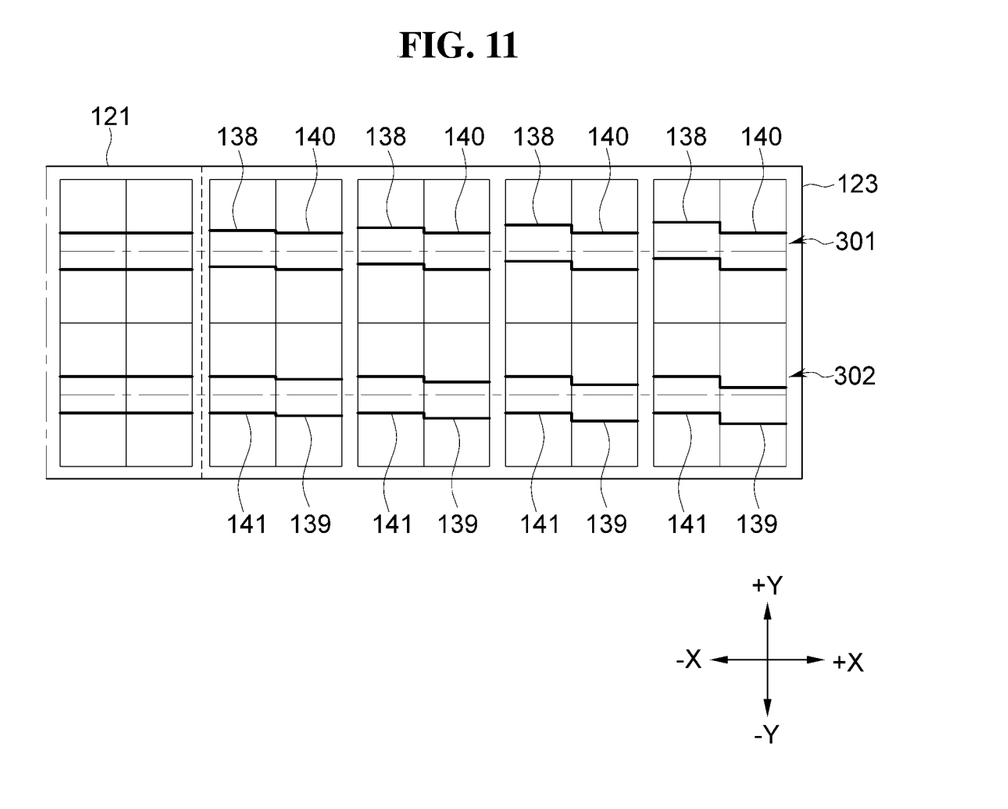
FIG. 11 is a plan view schematically illustrating pixel patterns/structures formed at a boundary exposure portion of an exposure mask according to a fourth embodiment.

FIG. 9 is a plan view schematically illustrating pixel patterns/structures formed at a boundary exposure portion of an exposure mask according to a second embodiment, FIG. 10 is a plan view schematically illustrating pixel patterns/structures formed at a boundary exposure portion of an exposure mask according to a third embodiment, and FIG. 11 is a plan view schematically illustrating pixel patterns/structures formed at a boundary exposure portion of an exposure mask according to a fourth embodiment.

An exposure mask includes an align exposure portion 121 which is aligned accurately with pixels P (see FIG. 5) defined on a substrate 111, and the exposure mask includes a boundary exposure portion 123 which has a pixel pattern shifted in a row direction or a column direction.

Referring to FIG. 9, an exposure mask according to a second embodiment includes an align exposure portion 121 which is aligned accurately with pixels defined on a substrate, and the exposure mask includes a boundary exposure portion 123 which is disposed adjacent to at least one side of the align exposure portion 121 and has a pattern shifted in the row direction, i.e., the ±X direction, with respect to the pixel defined on the substrate. The term "pattern" may mean "exposure-defining structure including a light transmitter and/or a light blocker."

The boundary exposure portion 123 includes a first row 301 and a second row 302. The first row 301 includes first patterns 128 arranged according to shift intervals which increase in the +X direction as a distance from the align exposure portion 121 increases, and the second row 302 includes second patterns 129 arranged according to shift intervals which increase in the −X direction, which is the opposite direction of the +X direction, as a distance from the align exposure portion 121 increases. In an embodiment, the +X direction and the −X direction are parallel to the first row 301 and the second row 302, but are opposite to each other.

For example, shift intervals of first patterns 128 in the first row 301 gradually and/or strictly increase by an amount in a range of about 0.4 μm to about 0.8 μm in the +X direction as the distance from the align exposure portion 121 increases, and shift intervals of second patterns 129 in the second row 302 gradually and/or strictly increase (relative to left/−X side shift intervals) by an amount in a range of about 0.4 μm to about 0.8 μm in the −X direction as the distance from the align exposure portion 121 increases.

Each first pattern 128 and a corresponding second pattern 129 are located at immediately neighboring pixel rows and are located at different pixel pattern columns that are immediately adjacent to each other.

A first pattern 128 and a corresponding second pattern 129 disposed in the immediately adjacent pixel pattern columns have shift intervals which are substantially equal to each other in size but are in opposite directions, i.e., in the +X direction and the −X direction, respectively. The first row 301 is immediately adjacent to the second row 302.

In an embodiment, the boundary exposure portion 123 includes a third row 303 and a fourth row 304. The third row 303, immediately adjacent to the second row 302, includes third patterns 130 arranged at shift intervals which increase in the −X direction as a distance from the align exposure portion 121 increases, and the fourth row 304 includes fourth patterns 131 arranged at shift intervals which increases in the +X direction as a distance from the align exposure portion 121 increases.

Each third pattern 130 and a corresponding fourth pattern 131 located at immediately neighboring pixel rows and are located at different pixel pattern columns that are immediately adjacent to each other.

A third pattern 130 and a corresponding fourth pattern 131 disposed in the immediately adjacent pixel pattern columns have shift intervals which are substantially equal to each other in size but are in opposite directions, i.e., in the −X direction and the +X direction, respectively. The third row 303 is immediately adjacent to the fourth row 304.

In an embodiment, a first pattern 128 and a corresponding third pattern 130 are located at a same pixel pattern column. In an embodiment, a second pattern 129 and a corresponding fourth pattern 131 are located at a same pixel pattern column. In an embodiment, a pattern 128/129 and a corresponding pattern 130/131 disposed at a same pixel pattern column have shift intervals which are substantially equal to each other in size but are in opposite directions, i.e., in the +X direction and the −X direction, respectively.

In an embodiment, the boundary exposure portion 123 may further include fifth patterns 132 and sixth patterns 133. Each fifth pattern 132 is disposed immediately adjacent to a corresponding first pattern 128 or a corresponding third pattern 130 in the first row 301 or the third row 303, and is aligned with a corresponding pixel area (i.e., not shifted in the row direction or the column direction with respect to the pixels defined on the substrate) to match (e.g., correspond to) a reference pattern. Each sixth pattern 133 is disposed immediately adjacent to a corresponding second pattern 129 or a corresponding fourth pattern 131 in the second row 302 or the fourth row 304 and is aligned with a corresponding pixel area (i.e., not shifted in the row direction or the column direction with respect to the pixels defined on the substrate) to match (e.g., correspond to) the reference pattern.

The first patterns 128 and the third patterns 130 may be configured for forming color filter patterns, e.g., blue pixel patterns; the second patterns 129 and the fourth patterns 131 may be configured for forming color filter patterns, e.g., red pixel patterns; the fifth patterns 132 may be configured for forming color filter patterns, e.g., red pixel patterns; the sixth patterns 133 may be configured for forming color filter patterns, e.g., blue pixel patterns. In an embodiment, each of sixth patterns 128, 129, 130, 131, 132, and 133 may be configured for forming a color filter pattern and/or may be configured for forming one of a blue pixel pattern, a green pixel pattern, and a red pixel pattern.

Referring to FIG. 10, the boundary exposure portion 123 according to a third embodiment includes a first row 301 and a second row 302. The first row 301 includes first patterns 134 arranged at shift intervals which increase in the +X direction as a distance from the align exposure portion 121 increases, and the second row 302 includes second patterns 135 arranged at shift intervals which increase in the +X direction as a distance from the align exposure portion 121 increases.

For example, shift intervals of the first patterns 134 in the first row 301 gradually increase (relative to left/−X side shift intervals) by an amount in a range of about 0.4 μm to about 0.8 μm in the +X direction as the distance from the align exposure portion 121 increases, and shift intervals of the second pattern 135 in the second row 302 gradually increase by an amount in a range of about 0.4 μm to about 0.8 μm in the +X direction as the distance from the align exposure portion 121 increases.

Each first pattern 134 and a corresponding second pattern 135 are located at different pixel pattern columns that are adjacent to each other. A first pattern 134 and a corresponding second pattern 135 disposed in the adjacent pixel pattern columns have shift intervals which are substantially equal to each other in the same +X direction. The first row 301 is adjacent to the second row 302.

In an embodiment, the boundary exposure portion 123 according to a third embodiment includes a third row 303 and a fourth row 304. The third row 303, adjacent to the second row 302, includes third patterns 136 arranged at shift intervals which increase in the −X direction as a distance from the align exposure portion 121 increases, and the fourth row 304 includes fourth patterns 137 arranged at shift intervals which increase in the −X direction as a distance from the align exposure portion 121 increases.

Each third pattern 136 and a corresponding fourth pattern 137 are located at different pixel pattern columns that are adjacent to each other. A third pattern 136 and a corresponding fourth pattern 137 disposed in the adjacent pixel pattern columns have shift intervals which are substantially equal to each other in the same −X direction. The third row 303 is adjacent to the fourth row 304.

In an embodiment, a first pattern 134 and a corresponding third pattern 136 are located at a same pixel pattern column. In an embodiment, a second pattern 135 and a corresponding fourth pattern 137 are located at a same pixel pattern column. In an embodiment, a pattern 134/135 and a corresponding pattern 136/137 arranged at a same pixel pattern column have shift intervals which are substantially equal to each other in size but are in opposite directions, i.e., in the +X direction and the −X direction, respectively.

In an embodiment, the boundary exposure portion 123 may further include fifth patterns 132 and sixth patterns 133. Each fifth pattern 132 is disposed adjacent to a corresponding first pattern 134 or a corresponding third pattern 136 in the first row 301 or the third row 303 and is aligned with a corresponding pixel area (i.e., not shifted in the row direction or the column direction with respect to the pixels defined on the substrate). Each sixth pattern 133 is disposed adjacent to a corresponding second pattern 135 or a corresponding fourth pattern 137 in the second row 302 or the fourth row 304 and is aligned with a corresponding pixel area (i.e., not shifted in the row direction or the column direction with respect to the pixels defined on the substrate).

The first pattern 134 and the third pattern 136 may be configured for forming blue pixel patterns; the second pattern 135 and the fourth pattern 137 may be configured for forming red pixel patterns; the fifth patterns 132 may be configured for forming red pixel patterns; the sixth pattern 133 may be configured for forming blue pixel patterns. In an embodiment, each of patterns 132, 133, 134, 135, 136, and 137 may be configured for forming a color filter pattern and/or may be configured for forming one of a blue pixel pattern, a green pixel pattern, and a red pixel pattern.

According to embodiments, the boundary exposure portion 123 has substantially equal shift intervals in opposite directions, so that an overlay may be gradually changed, and difference in shift intervals between two rows may be compensated for.

According to embodiments, since the boundary exposure portion 123 includes patterns which are arranged at shift intervals gradually increasing or decreasing in the row direction with respect to the pixels P (see FIG. 5) and have substantially equal amounts of increase or decrease in the column direction, overlay may be gradually changed, and differences in shift intervals between two rows may be compensated for. Advantageously, the stitch area may be substantially inconspicuous in displayed images.

FIG. 11 is a plan view schematically illustrating pixel patterns/structures formed at a boundary exposure portion of an exposure mask according to a fourth embodiment.

Referring to FIG. 11, an exposure mask according to a fourth embodiment includes an align exposure portion 121 which is aligned accurately with pixels defined on a substrate, and the exposure mask includes a boundary exposure portion 123 which is disposed adjacent to at least one side of the align exposure portion 121 and has patterns shifted in the column direction, i.e., the ±Y direction, with respect to the pixels defined on the substrate.

The boundary exposure portion 123 according to a fourth embodiment a first row 301 and a second row 302. The first row 301 includes first patterns 138 arranged at shift intervals which increases in the +Y direction as a distance from the align exposure portion 121 increases, and the second row 302 includes second patterns 139 arranged at shift intervals which increase in the −Y direction, which is the opposite direction of the +Y direction, as a distance from the align exposure portion 121 increases. In an embodiment, the +Y direction and the −Y direction are parallel to the first row 301 and the second row 302, but are opposite to each other.

The first patterns 138 and the second patterns 139 are located at different pixel pattern columns. A first pattern 138 and a corresponding second pattern 139 disposed in adjacent pixel pattern columns have shift intervals which are substantially equal to each other in size but are in opposite directions, i.e., in the +Y direction and the −Y direction, respectively. The first row 301 is adjacent to the second row 302. First rows 301 may be alternately arranged with second rows 302.

In an embodiment, the boundary exposure portion 123 according to a fourth embodiment may further include third patterns 140 and fourth patterns 141. Each third pattern 140 is disposed adjacent to a corresponding first pattern 138 in the first row 301 and is aligned with a corresponding pattern of the portion 121, i.e., not shifted in the column direction (±Y direction) with respect to the pixels defined on the substrate, to match (e.g., correspond to) a reference pattern. Each fourth pattern 141 is disposed adjacent to a corresponding second pattern 139 in the second row 302 and is aligned with corresponding pattern of the portion 121, i.e., not shifted in the row direction or the column direction with respect to the pixels defined on the substrate, to match (e.g., correspond to) the reference pattern.

In an embodiment, the pattern formed at the boundary exposure portion 123 may be a black matrix pattern. In an embodiment, the first patterns 138 are shifted at intervals gradually increasing by about 0.4 μm toward an upper side (+Y direction in the drawings) with respect to the patterns of the align exposure portion 121 according to distances from the align exposure portion 121, and the second patterns 139 are shifted at intervals gradually increasing by about 0.4 μm toward a lower side (−Y direction in the drawings) with respect to the pattern of the align exposure portion 121 according to distances from the align exposure portion 121.

According to embodiments, shift intervals corresponding to the upper side and the lower side may be superimposed and combined, and thus an overlay deviation may be reduced.

As set forth hereinabove, according to embodiments, stitch defects may substantially inconspicuous in images displayed by a display device, thus satisfactory image quality of the display device may be attained.

While example embodiments have been illustrated and described, various changes to the example embodiments may be implemented without departing from the spirit and scope defined by the claims.

What is claimed is:

1. An exposure mask for use in an exposure process for manufacturing a display device, the exposure mask comprising:

an aligning exposure portion configured to be aligned with pixel areas defined on a substrate, wherein the aligning exposure portion comprises a first aligning exposure-defining element and a second aligning exposure-defining element; and a boundary exposure portion disposed adjacent to at least one side of the aligning exposure portion, wherein the boundary exposure portion comprises a first boundary exposure-defining element, a second boundary exposure-defining element, a third boundary exposure-defining element, and a fourth boundary exposure-defining element, wherein the first aligning exposure-defining element, the first boundary exposure-defining element, and the second boundary exposure-defining element are positioned in a first row of the exposure mask, wherein the first boundary exposure-defining element is positioned between the first aligning exposure-defining element and the second boundary exposure-defining element and is larger than the second boundary exposure-defining element, wherein the second aligning exposure-defining element, the third boundary exposure-defining element, and the fourth boundary exposure-defining element are positioned in a second row of the exposure mask, wherein the third boundary exposure-defining element is positioned between the second aligning exposure-defining element and the fourth boundary exposure-defining element and is smaller than the fourth boundary exposure-defining element, and wherein each of the exposure-defining elements is or comprises a light transmitter or a light blocker.

2. The exposure mask of claim 1, wherein an area reduction rate of the first boundary exposure-defining element with respect to the first aligning exposure-defining element is substantially equal to an area increase rate of the third boundary exposure-defining element with respect to the second aligning exposure-defining element.

3. The exposure mask of claim 1, further comprising a third row positioned between the first row and the second row of the exposure mask, wherein the aligning exposure portion further comprises a third aligning exposure-defining element, wherein the boundary exposure portion further comprises a fifth boundary exposure-defining element, wherein the third aligning exposure-defining element and the fifth boundary exposure-defining element are positioned in the third row of the exposure mask and have a same size.

4. The exposure mask of claim 3, wherein the fifth boundary exposure-defining element corresponds to a first pixel area column defined on the substrate, wherein the first boundary exposure-defining element and the third boundary exposure-defining element correspond to a second pixel area column defined on the substrate, and wherein the first pixel area column is different the second pixel area column.

5. The exposure mask of claim 1, wherein the first and second aligning exposure-defining elements and the first, second, third, and fourth boundary exposure-defining elements each are configured for forming one of a spacer, a contact hole, and a common electrode of the display device.

* * * * *